(12) United States Patent
Khan et al.

(10) Patent No.: US 6,518,192 B2
(45) Date of Patent: *Feb. 11, 2003

(54) TWO ETCHANT ETCH METHOD

(75) Inventors: Anisul Khan, Sunnyvale, CA (US); Ajay Kumar, Sunnyvale, CA (US); Jeffrey D. Chinn, Foster City, CA (US); Dragan Podlesnik, Palo Alto, CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/013,115

(22) Filed: Dec. 7, 2001

(65) Prior Publication Data

US 2002/0052113 A1 May 2, 2002

Related U.S. Application Data

(63) Continuation of application No. 09/513,552, filed on Feb. 25, 2000, now Pat. No. 6,284,667.

(51) Int. Cl.$^7$ ............................................... H01L 21/00
(52) U.S. Cl. ............................. 438/714; 216/2; 216/67; 216/79; 438/719; 438/735; 438/734
(58) Field of Search ........................... 438/9, 712, 714, 438/715, 719, 735, 734, 743, 744; 216/2, 67, 79

(56) References Cited

OTHER PUBLICATIONS

US 6,284,667, 9/2001, Khan et al. (withdrawn)*

* cited by examiner

Primary Examiner—William A. Powell
(74) Attorney, Agent, or Firm—Scott W. Hewett; Joseph Bach

(57) ABSTRACT

A two-step etch method for etching a masked layer or layers that include fast and slow etching regions is described. Fast and slow etching regions may arise in a variety of devices, such as microelectrical mechanical system ("MEMS") applications and mixed signal (i.e. analog and digital) integrated circuits, as well as other integrated circuits and devices. In one embodiment, a first etchant is used to etch through the layer in the fastest etching region, and then a second etchant is used to complete etching through the layer in the slowest etching region.

18 Claims, 7 Drawing Sheets

TWO ETCHANT ETCH METHOD

CROSS-REFERENCE TO RELATED APPLICATIONS

This application is a continuation of U.S. patent application Ser. No. 09/513,552 entitled A Two Etchant Etch Method, filed Feb. 25, 2000, now U.S. Pat. No. 6,284,667 by Anisul Khan, Ajay Kumar, Jeff Chinn, and Dragan Podlesnik, the disclosure of which is hereby incorporated in its entirety for all purposes.

BACKGROUND OF THE INVENTION

1. Field of the Invention

The present invention relates to etch processes for fabricating integrated semiconductor circuits, Micro Electro Mechanical Systems (MEMS) structures and combined structures having electronics and MEMS.

2. Description of Related Art

As the integrated circuit industry continues to explore techniques to pack more circuits onto a given semiconductor substrate, more and more thought is devoted to orienting devices vertically. One technique of orienting devices vertically is to bury the devices in trenches formed within the face of a silicon substrate. Another technique of orienting devices vertically is to build the devices up from the substrate surface. An example of a device that employs the technique of building devices up from the substrate is a silicon on insulator (SOI) device.

FIG. 1 illustrates a representative mask structure 1 that could be useful in forming an SOI device. SOI devices are characterized by a thin insulative layer of material (commonly referred to in the art as a buried oxide layer) that is sandwiched between the silicon substrate and circuit elements of the device. Typically, no other layer of material is interposed between the buried oxide layer and the silicon substrate. As shown in FIG. 1, buried oxide layer 4 is positioned between silicon substrate 2 and silicon layer 6. Mask structure 1 represents a conventional mask structure used to form SOI devices. As shown in FIG. 1, mask layer 12 is formed over nitride layer 10, which is formed, in turn over oxide layer 8. While specific layer thicknesses vary depending upon application, a representative layer thickness or each layer is (a) about 15,000 Å for mask layer 12; (b) about 2000 Å for nitride layer 10; (c) about 10,000 Å for oxide layer 8; (d) between about 22 to 28 µm for silicon layer 6; and (e) about 5000 Å for buried oxide layer 4. When pattern structure 1 is etched in accordance with well known etching methods, trenches are formed in silicon layer 6 as the mask pattern is transferred into the silicon layer 6. In accordance with these well known methods, etching of silicon layer 6 continues until buried oxide layer 4 is reached. General requirements for the trenches formed in silicon layer 6 are vertical sidewalls (i.e., sidewalls of about 89°+/−1°) with minimal erosion of buried oxide layer 4. It is to be appreciated that Mask structure 1 could be formed from a wide variety of materials. For example, mask layer 12 could be formed from an oxide a nitride or a metal. Silicon layer 6 could be formed from, for example, epitaxial silicon, polysilicon, doped polysilicon or amorphous silicon.

The increased use of SOI structures has resulted in a desire to fabricate a growing number of devices and to combine a wide variety of device structures on a single workpiece. SOI is being used to form capacitors, and circuits for high frequency devices such as laptop computers and mobile phones. In addition to an increasing variety of electronics, SOI structures are being utilized to form accelerometers, cantilever beams and other Micro-Electro-Mechanical-System (MEMS) devices that typically incorporate mechanical and electronic components on same device. The increasing variety of structures to be fabricated, and the desire to integrate them onto a single workpiece has lead to increased fabrication complexity.

Referring again to FIG. 1, Mask structure 1 illustrates many of the challenges involved in fabricating complex structures such as, for example, an SOI structure. A first challenge arises from the fact that mask structure 1 can include regions having a variety of critical dimensions, which dimensions range, for example, from sub-micron up to several microns. Regions having small critical dimensions, such as for example small critical dimension region 16, may have critical dimensions on the order of about 0.1 µm to about 0.2 µm. Some regions may have intermediate range critical dimensions, such as medium critical dimension region 18 where critical dimension ranges, for example, from 0.2 µm to about 1 µm. Still other regions may have large critical dimensions such as large critical dimension region 20 where critical dimensions range from, for example, 1 µm to several microns.

A second challenge arises from the fact that mask structure 1 includes regions having varying degrees of line density. Regions of high line density such as high-density region 22 and low line density such as low line density region 26 are present in Mask structure 1. Mask structure 1 also includes isolated lines, such as for example, isolated line 28.

A third challenge arises from the fact that mask structure 1 also includes both high open area percentage structures and low open area percentage structures. Open area percentage is defined as a ratio between an area of silicon to be etched to a total area of the silicon substrate surface. Open area percentage can be measured on a micro level, for example, the open area percentage for a specific die pattern or on a macro level, for example, the overall open area percentage for a number of die patterns distributed across the substrate. Typical design parameters for electronic device applications such as deep trench isolation, power devices. and high frequency silicon on insulator devices call for open area percentages of less than about 20. On the other hand, design parameters for MEMS applications typically have open area percentages of more than about 20 and may have open area percentages as high as about 80. Mask structure 1 represents both low open area percentage regions, such as region 30, and high open area percentage regions, such as region 32.

When epitaxial silicon is used as the silicon layer in an SOI structure, the epitaxial silicon is generally formed by bonding the silicon surfaces of two silicon wafers together and then either thinning or separating the substrates to reveal an epitaxial layer. Various bonding and thinning methods have been proposed and are under development; however, silicon bonding remains an expensive and time-consuming process for obtaining epitaxial silicon. In contrast, deposited silicon, typically polysilicon or amorphous silicon, remains a more economic alternative to the expensive bonded epitaxial silicon techniques. However, the use of deposited silicon is not without problems.

In general, the thickness uniformity of deposited silicon is relatively high, for example, on the order of about 15–20%. For example, a layer of deposited polysilicon with a target thickness of about 26 µm may have areas with thicknesses ranging from about 24 µm to about 30 µm. Variations in thickness can complicate an etch process, and particularly an etch process conducted on complicated structures such as mask structure 1 of FIG. 1. One such complication is notching which is illustrated in FIG. 2. Another complication of continued etching after the removal of the silicon layer is erosion of the buried oxide layer. In spite of these shortcomings, the lower cost, widespread availability and familiarity with silicon deposition techniques and systems, ensures deposited silicon will remain a material of choice in future electronic and MEMS applications.

Etch processes can be categorized as dry or wet. Both types of etch processes are employed in MEMS and electronics fabrication processes. Wet etch chemistry typically involves exposing a structure to a liquid chemical bath containing an etchant solution. Common wet etch processes involve immersing the structure in the etchant containing chemical bath, such as for example a buffered HF solution, until the desired etching is complete.

Dry etch chemistry typically involves exposing a structure a plasma containing an etchant. Common plasma processes for etching silicon typically utilize, for example, a single step, $SF_6/O_2$ based plasma, either alone or in combination with a passivating agent such as, for example, HBr, $C_4F_8$, $CHF_3$ or $CH_2F_2$. A problem common to wet and dry etch methods is an inability to compensate for etch rate variations caused by structural variation (i.e., variations in line density, critical dimension and open area percentage) and layer thickness variations present in a layer of a structure being etched. Variations in structure often result in variations in etch rate. For example, an area with large critical dimensions will generally experience higher etch rates than a region with smaller critical dimensions. In general areas with higher etch rates will etch through a layer and reach an underlying layer in advance of regions having slower etch rates. However, in common etch processes, etch duration is generally determined by the etch rate of the slowest etching region to achieve complete removal of the layer to be etched.

A problem associated with etch duration based on the slowest etching region is that higher etch rate regions will etch through the layer first, and continue to etch, at varying degrees, the surrounding etch layer and the exposed underlying layer. FIG. 2 represents, a portion of an SOI structure 50 having a silicon layer 52 and a buried oxide layer 54 formed on top of a silicon substrate 56. The trench 58 exists in a region with an etch rate faster than the slowest etch rate used to determine the duration of the etch. Since trench 58 is formed in a region having a relatively higher etch rate than the slowest etch rate region, etching will continue in trench 58 to expose buried oxide layer 54. As a result of continued etching after reaching buried oxide layer 54, the bottom of trench 58 exhibits loss of sidewall profile control 60 that is commonly referred to in the art as notching. The resulting sidewall profile created by notching increases the complexity of subsequent deposition operations intended to fill trench 58 often resulting in portions of the notched area not being filled by the subsequent deposition processes. As etching continues in trench 58, the notched region 60 enlarges and buried oxide layer 54 erodes 62 potentially resulting in diminished device performance or failure.

In light of the above, there is a need in the art for an etching method capable of etching a layer in a structure while compensating for etch rate variations that occur between different regions of the structure.

SUMMARY OF THE INVENTION

Embodiments of the present invention advantageously provide an etch method which meets the need in the art relate art for an etching method capable of etching a layer in a structure and compensating for etch rate variations that occur between different regions of the structure. In particular, one embodiment of the present provides a method of etching a layer formed over an underlying layer in a structure, the method comprising the steps of: exposing the structure to a first etchant that etches a portion of the layer for a period of time sufficient for a region of the layer with a fastest etch rate to etch through the layer; and exposing the structure to a second etchant that etches a portion of the layer for a period of time sufficient for a region of the layer with a slowest etch rate to etch the layer.

BRIEF DESCRIPTION OF DRAWINGS

The teachings of the present invention can be readily understood by considering the following detailed description in conjunction with the accompanying drawings, in which.

To facilitate understanding, identical reference numbers are used, where possible, to designate identical elements that are common to the figures.

DETAILED DESCRIPTION OF THE PREFERRED EMBODIMENTS

Figure 1:
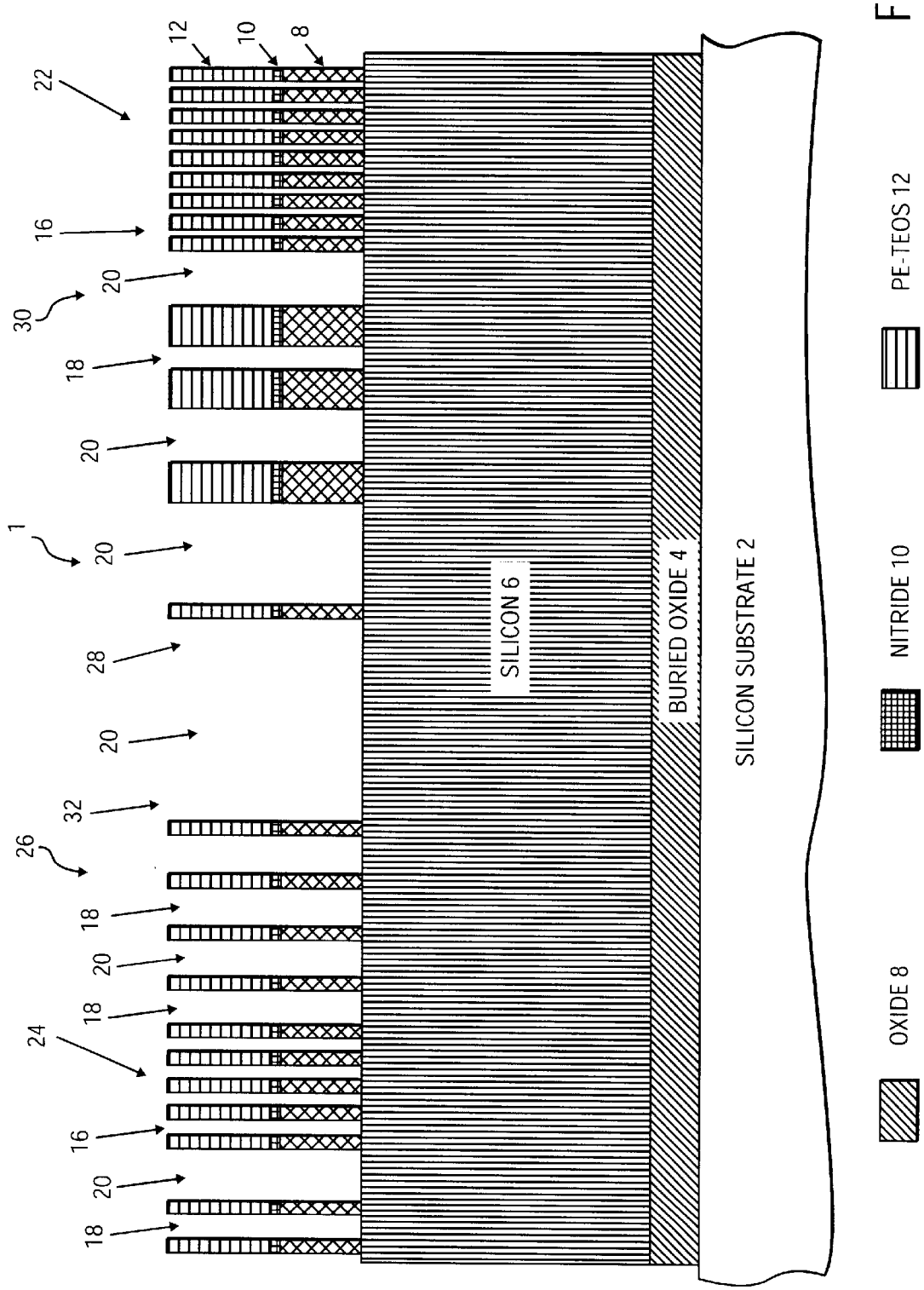
FIG. 1 is a cross-section view of a mask structure.
Figure 2:
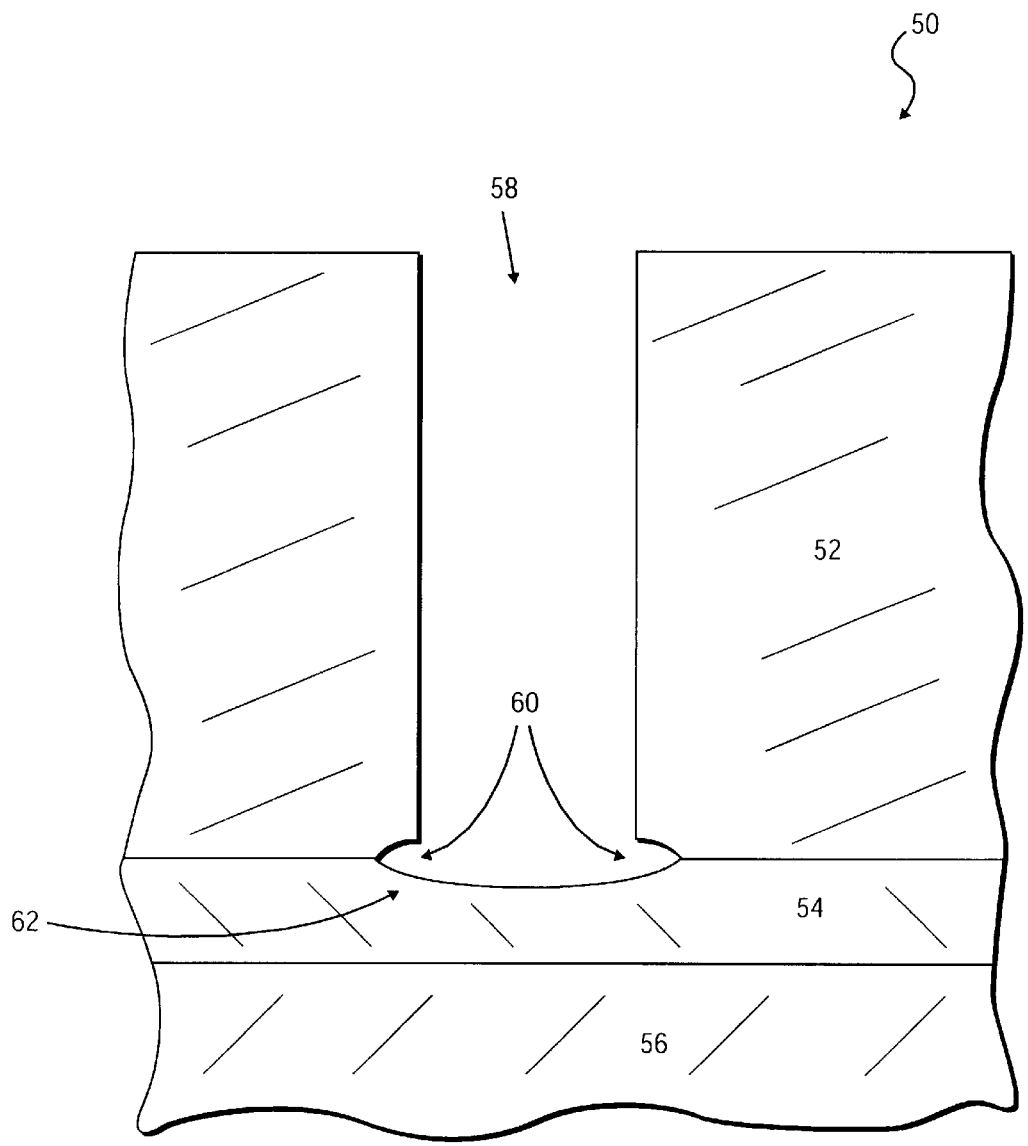
FIG. 2 is a cross-section view of a trench illustrating loss of bottom profile control.

Embodiments of the present invention provide an etch process that is advantageously useful in etching a layer in a structure having various critical dimensions, line densities and open area percentages. Embodiments of the present invention may be particularly useful in etching, for example, a layer of silicon that is part of a silicon on insulator (SOI) structure, MEMS structure or structure having a combination of MEMS and electronics patterns. In addition, etch processes according to embodiments of the present invention may be utilized to advantageously etch layers of material having below average thickness uniformity in a mask structure that also includes various critical dimensions, line densities and open area percentages.

In an embodiment according to the present invention, a mask structure having a layer and an underlying layer is exposed to a first etchant and a region of the mask structure with a fastest etch rate is determined. Etching with the first etchant continues until a region of the structure with a fastest etch rate etches the layer. The structure is exposed to a second etchant and a region of the structure with a slowest etch rate is determined. Etching with a second etchant continues until a region with a slowest etch rate etches a layer. In another embodiment of the present invention, the second etchant provides sidewall passivation to the layer. In yet another embodiment of the present invention, the second etchant is selective to an underlying layer. An embodiment of the etch process of the present invention may provide an anisotropic etch profile with nearly vertical, smooth sidewalls with minimal erosion of an underlying layer. In this context, nearly vertical sidewalls refer to sidewalls that are 89°+/−1°. relative to the etching plane of the substrate.

In one aspect of the present invention, the first etchant is selected based upon the open area percentage in a mask structure being etched. In an embodiment of the present invention in accord with this aspect of the present invention, the first etchant is selected depending upon the open area percentage in a mask structure such as selecting a particular first etchant when open area percentage is high (i.e., open area percentage greater than or about 20) or selecting a different particular first etchant when the open area percentage is low (i.e., open area percentage less than about 20).

In another aspect of the present invention, an embodiment of the etch method is a clean etch process. In this context, a clean etch process refers to the small amount or lack of etch byproduct remaining in the etch process chamber at the end of an etch process. Some embodiments of the second etchant of the present invention are residue forming etchants. To compensate for this residue formation, an embodiment of the first etchant of the present invention is provided that removes the residue formed by etching a previous substrate with a residue forming second etchant.

For example, a first substrate is processed according to an embodiment of the present invention wherein the second etchant is a residue forming etchant. Thus, at the end of etching with the second etchant, residue remains in the etch chamber. When a subsequent substrate is etched, a first etchant may be selected that etches the layer to be etched on the present substrate while also removing or cleaning the residue generated by etching the previous substrate. Embodiments of the present invention have been used in sequential wafer processing operations where more than 300 wafers have been processed without producing chamber residue, or requiring the chamber to be taken out of service and wet cleaned.

Embodiments of the present invention are particularly useful in etching, for example, a silicon layer formed as part of a silicon on insulator (SOI) structure. The silicon layer may be epitaxial silicon, polysilicon, doped polysilicon, amorphous silicon or combinations thereof. FIG. 1 illustrates a representative mask structure 1 used to form SOI structures. SOI device structures are characterized by a thin insulative layer of material (commonly referred to in the art as a buried oxide layer) that is sandwiched between the silicon substrate and circuit elements of the device. Typically, no other layer of material is interposed between the buried oxide layer and the silicon substrate. As shown in FIG. 1, buried oxide layer 4 is positioned between a silicon substrate 2 and a silicon layer 6. Mask structure 1 represents a conventional mask structure used to form SOI devices.

Figure 3:
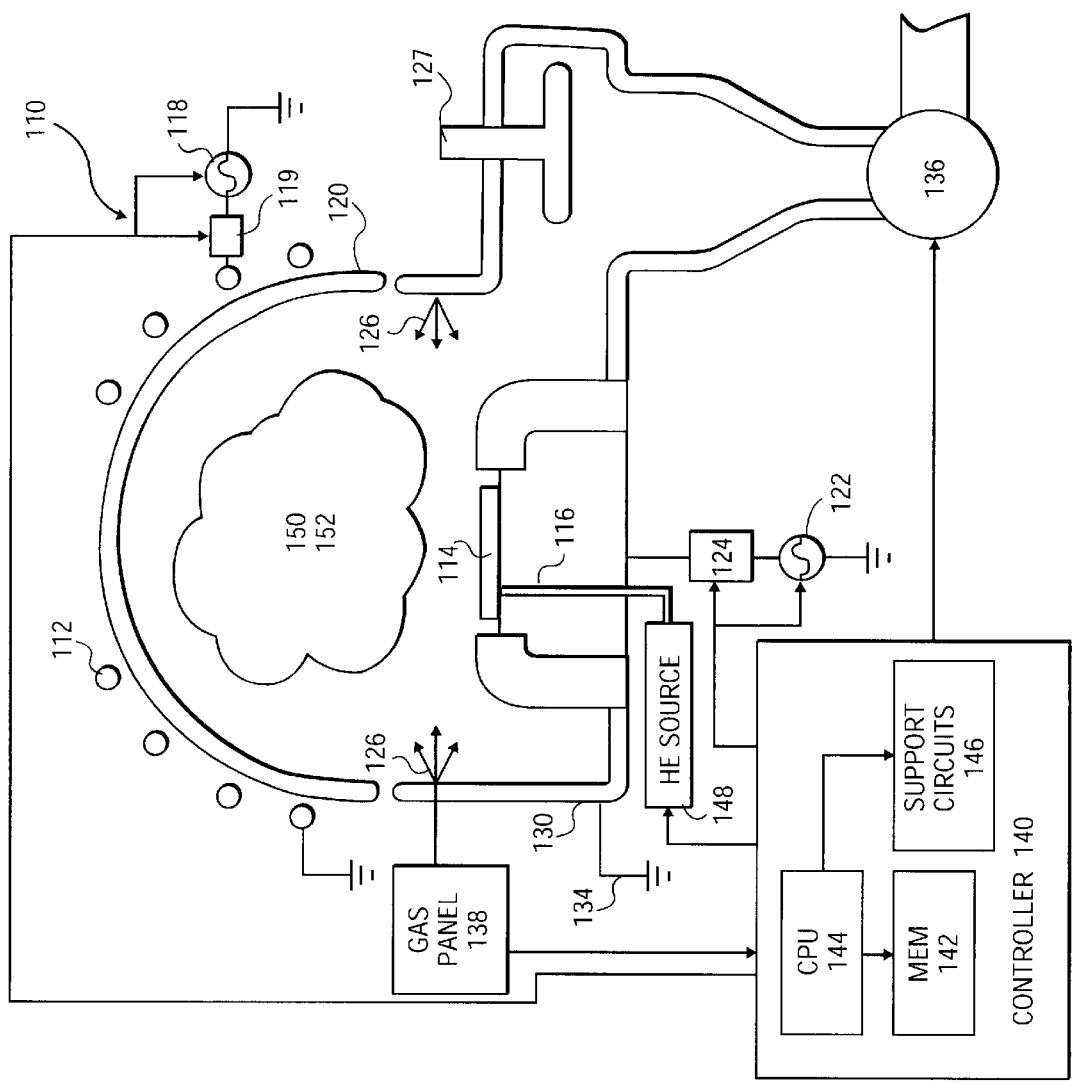
FIG. 3 is a schematic, cross section view of a plasma etch chamber in which embodiments of the inventive method of FIG. 4 can be performed.

An embodiment of the two etchant etch process according to the present invention may be reduced to practice in a number of etching systems. One such etching system is a Decoupled Plasma Source (DPS) Centura etch system available from Applied Materials, Inc., of Santa Clara, Calif. FIG. 3 depicts a schematic diagram of the DPS etch process chamber 110, that comprises an inductive coil antenna segment 112, positioned exterior to a dielectric, dome shaped ceiling 120 (referred hereinafter as dome 120). The antenna segment 112 is coupled to a radio-frequency (RF) source 118 that is generally capable of producing an RF signal of about 200 W–3000 Watts having a tunable frequency of about 12.56 MHz. The RF source 118 is coupled to the antenna segment 112 via a matching network 119. The process chamber 110 also includes a substrate support pedestal (cathode) 116 that is coupled to a second RF source 122 capable of producing an RF signal of about 10 W–200 Watts having a frequency of approximately 400 kHz. The second RF source 122 is coupled to the substrate support pedestal 116 through a matching network 124. Hereinafter, the first and second RF sources 118, 122 will be referred to, respectively, as RF source generator 118 and RF bias generator 122, respectively. Chamber 110 also contains a conductive chamber wall 130 that is coupled to an electrical ground 134. A controller 140 comprising a central processing unit (CPU) 144, a memory 142, and support circuits 146 for the CPU 144 is coupled to the various components of the DPS process chamber 110 to facilitate control of the etch process.

In operation, a semiconductor substrate 114 is placed on the substrate support pedestal 116 and gaseous components are supplied from a gas panel 138 to the process chamber 110 through inlets 126 to form a gaseous mixture 150. The gaseous mixture 150 is ignited into a plasma 152 in the process chamber 110 by applying RF power from the RF source and bias generators 118 and 122, respectively, to the antenna segment 112 and the substrate support pedestal 116. The pressure within the interior of the process chamber 110 is controlled using a throttle valve 127 situated between the chamber 110 and a vacuum pump 136. The temperature at the surface of the chamber wall 130 is controlled using liquid containing conduits (not shown) that are located within the walls 130 of the chamber 110. For example, the walls 130 can be maintained at about 65 degrees Celsius during processing.

The temperature of the substrate 114 is controlled by stabilizing the temperature of the support pedestal 116 and providing He gas from a He source 148 to channels formed between the back of the substrate 114 and grooves (not shown) on the surface of support pedestal 116. The He facilitates heat transfer between the substrate 114 and the support pedestal 116. During the etch process, the substrate 114 is gradually heated by the plasma 150 to a steady state temperature. Typically, substrate 114 is maintained in a temperature range of between about −40 to about 60 degrees Celsius with a preferred operating range of about 15 to about 20 degrees Celsius.

To facilitate control of the chamber as described above, the CPU 144 may be one of any form of general purpose computer processors that can be used in an industrial setting for controlling the various chamber components and even other processors in a processing system where computer controlled chamber components are utilized. The memory 142 is coupled to the CPU 144. The memory 142, or computer readable medium, may be one or more of readily available memory such as random access memory (RAM), read only memory (ROM), floppy disk drive, hard disk, or any other form of digital storage, local or remote. The support circuits 146 are coupled to the CPU 144 for supporting the processor in a conventional manner. Support circuits 146 include cache, power supplies, clock circuits, input/output circuitry and subsystems, and the like. An etch process, such as the etch process 300 of FIG. 3, is generally stored in the memory 142, typically as a software routine. The software routine may also be stored and/or executed by a second CPU (not shown) that is remotely located from the hardware being controlled by the CPU 144.

Figure 4:
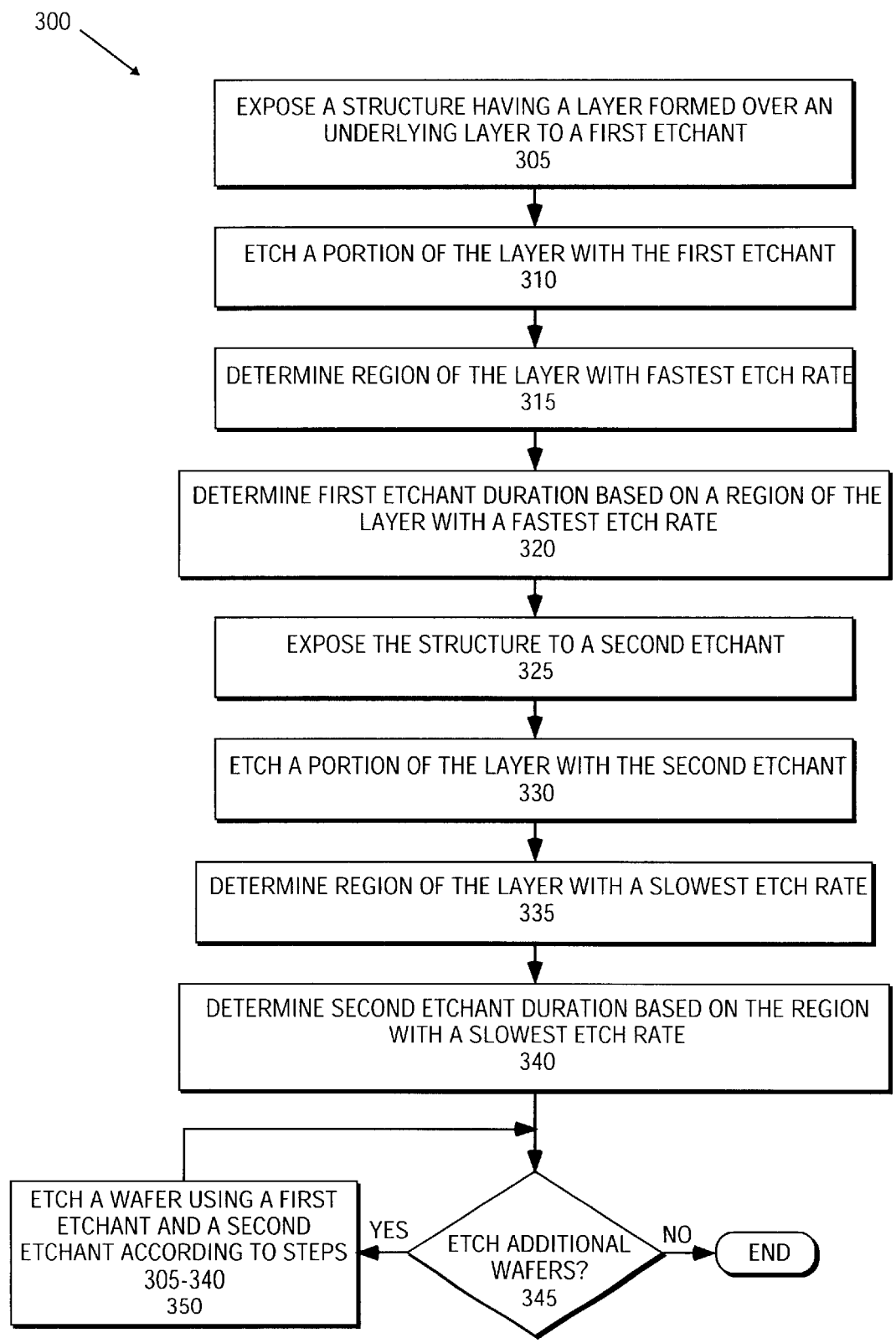
FIG. 4 is a block diagram of an embodiment of the inventive etch method.

The software routine executes the etch process, such as process 300 of FIG. 4, to operate the chamber 110 to perform the steps of the process. When executed by the CPU 144, the software routine transforms the general purpose computer into a specific process computer (controller) 140 that controls the chamber operation to perform a process such as etch process 300. Although embodiments of the present invention are discussed as being implemented as a software routine, some or all of the method steps that are discussed herein may be performed in hardware as well as by the software controller. As such, the invention may be implemented in software and executed by a computer system, in hardware as an application-specific integrated circuit or other type of hardware implementation, or in a combination of software and hardware.

An etch method according to the present invention may be better appreciated by turning to process 300 of FIG. 4. First, expose a structure to a first etchant for a period of time sufficient for a fastest etching region of the structure to etch a layer (steps 305–320). Second, expose a structure to a second etchant for a period of time sufficient for a slowest etch rate region to etch a layer (steps 325–340). The first and second etchants characterized using steps 305–340 of process 300 (FIG. 4) may be used to etch additional wafers in the same batch of wafers or other wafers having a similar mask structure (steps 335–340).

According to step 305, expose a structure having a layer formed over an underlying layer to a first etchant. A structure may be exposed to a first etchant in a number of ways depending, for example, on the type and form of etchant used (i.e., gas or liquid), and the type of etch process utilized (i.e., wet etch or dry etch). In an embodiment where the etch process is a dry etch or a plasma etch process, the structures formed on a substrate loaded into a plasma etch chamber are exposed to the first etchant when the etchant, typically provided as a gas, is provided into the etch chamber and ignited into a plasma. Referring by way of example and not limitation to etch chamber 110 of FIG. 3, a substrate 114 may be loaded into the etch chamber and an etchant from the gas panel is provided into the chamber and ignited into a plasma by coupling RF energy from source and bias RF generators into the etch chamber. The resulting plasma etches the layers of material formed on the structure.

First, according to step 305, expose a structure having a layer formed over an underlying layer to a first etchant. In one embodiment of the present invention, a first etchant is formed that includes an etchant gas and a passivation gas. A preferred etchant gas contains fluorine that acts as the primary etchant. Fluorine may be provided from any of a number of multi-fluorine atom compounds such as, for example, $CF_4$, $NF_3$ and $SF_6$. A preferred etchant source gas is $SF_6$.

The passivation source gas is used to promote deposition on sidewalls referred to in the art as sidewall passivation. Sidewall passivation helps control the etch profile by preventing lateral erosion of the etching layer. The passivation source gas may be provided from a single gas source. In one embodiment, the passivation source gas is formed a gaseous mixture of at least two gases. In a specific embodiment, the passivation source gas is formed from a gaseous mixture of HBr and oxygen. Oxygen can be supplied from any of a number of compounds such as, for example, oxygen or oxygen diluted in an inert gas. A diluted oxygen source gas could be provided in a suitable diluted ratio, such as for example, a ratio of about 70% inert gas and 30% $O_2$. One representative inert gas is helium. A preferred oxygen source gas is $O_2$.

In one embodiment, the first etchant includes passivation gas mixture of HBr and $O_2$ and a fluorine source gas where about 30% of the first etchant is provided by the fluorine source gas. In another embodiment the first etchant includes a fluorine source gas and passivation gas mixture of HBr and $O_2$ where the passivation gas mixture provides about 70% of the first etchant and the percentages of HBr and $O_2$ in the passivation gas mixture are about equal. In yet another embodiment, the first etchant is formed from a gaseous mixture where $SF_6$ is the fluorine source gas and passivation source gas is a gas mixture of HBr and $O_2$ where the flow rates of $O_2$ and HBr are about equal and the flow rate of the $O_2$ is greater than the flow rate of the $SF_6$. In a specific embodiment, the first etchant is a plasma formed from a gaseous mixture of a fluorine source gas and passivation gas mixture of HBr and $O_2$, the total gas flow of the gaseous mixture contains about 34% $O_2$, 34% HBr and about 31% $SF_6$. In another specific embodiment, the $O_2$ flow rate is about 60 sccm, the HBr flow rate is about 60 sccm and the $SF_6$ flow rate of about 55 sccm.

In a preferred embodiment of a first etchant according to the present invention, the first step plasma etch, the first etchant is formed from an etchant gas and a passivation gas where the etchant gas is $SF_6$ and the passivation gas is formed from HBr and $O_2$ and the respective flow rates of each gas are determined by (1) maintaining the ratio of the $SF_6$ flow rate to $O_2$ flow rate between about 0.5 to about 1.5 while also (2) maintaining between about 0.2 to about 4.2 the ratio obtained by dividing the sum of the $SF_6$ flow rate and the $O_2$ flow rate by the HBr flow rate.

In one embodiment of a plasma etch process according to the present invention, the first etchant is a plasma ignited by the energy provided from the RF source and RF bias generators (FIG. 3). In one embodiment, the RF source power level is less than about 1000 Watts and the ratio of RF source power level to RF bias power level is about 35:1. In another specific embodiment, the first etchant includes $O_2$ and HBr with about equal flow rates and a fluorine source gas with a flow rate of about 55 sccm, that is ignited into a plasma with a source RF power level of about 700 W, a bias power level of about 20 Watts and a chamber pressure of about 25 mT.

Next, according to step 310, etch a portion of the layer with the first etchant. This step represents the process of determining a region of the mask structure with a highest etch rate. By identifying a region with a highest etch rate, the duration of the etch process performed by the first etchant may be limited to minimize over etching. This step provides a relative measure of first etchant etch rate non-uniformity caused by the mask structure, such as, for example, variations in critical dimension and line density. In an embodiment of the present invention, the first etchant is a plasma etchant that provides silicon etch rates of more than about 1.5 $\mu$m/min, and preferably etches silicon at rates of about 4 $\mu$m/min.

Initial thickness measurements are taken in the mask structure before etching a portion of the layer with the first etchant (step 310). Thickness measurements here refer to obtaining the thickness of the layer to be etched in the various regions of the mask structure. In an embodiment where the first etchant is a plasma etch, the measured substrate is placed in a suitable etch processing reactor, such as etch chamber 110 of FIG. 3. A plasma is formed from the first etchant and the mask structure is exposed to the plasma for a period of time sufficient to obtain etch rate information from the various regions of the mask structure. In most plasma etch processes, etching for a period of time ranging from about 90 to about 300 seconds is sufficient. The period of time needed to evaluate the etch rate will vary depending on a number of factors such as, for example, the critical dimensions in the structure, etch depth and type of etch process selected i.e., wet etch or dry etch; capacitively coupled plasma or remotely generated plasma, and so forth. Once the mask structure has exposed to the plasma process chemistry for a period of time sufficient to obtain etch rate information, the substrate is removed from the etch chamber and the layer measured to determine the amount etched in each of the various regions of the mask structure.

Next, according to step 315, determine a region of the mask structure with a fastest etch rate. The etch rate in a particular region is readily calculated by dividing the layer thickness etched during step 310 and dividing by the duration of the etch process conducted in step 310. Once a region of the mask structure with a highest etch rate is identified, the etch rate of that region is used to determine the duration of the first etchant etch process (step 320). The duration of the first etchant etch process is determined by calculating the time when etching a layer in a region with a fastest etch rate is complete. Referring by way of example to mask structure 1 of FIG. 1, a fastest etch rate is evaluated by how quickly silicon layer 6 is etched in a particular region.

By limiting the first etchant etch duration to the etch rate at which the fastest etching region of the mask is etched, two important purposes are accomplished. First, the fastest etch rate is allowed to proceed completely through the layer so that in that region and in regions with etch rates comparable to that region, the layer etch is complete. This optimized use of the fastest etch rate increases throughput. Second, by limiting the duration of the first etchant etch to the time in which etching is completed in the fastest etch rate region, the likelihood that notching will occur in faster etch rate regions is reduced since the first etchant etch process ceases when etching in the fastest etching region is complete. Referring by way of example to mask structure of FIG. 1, limiting the first etchant etch to the time it takes the highest etch rate region to etch through silicon layer 6 ensures that the duration of buried oxide layer 4 exposure to the first etchant etch is reduced since the first etchant etch ends when the fastest etching region exposes buried oxide layer 4. In summary, optimization of the first etchant etch based upon the etch rate of a fastest etch rate region provides increased throughput while reducing the likelihood of erosion in layer sidewalls and underlying layers.

Figure 5:
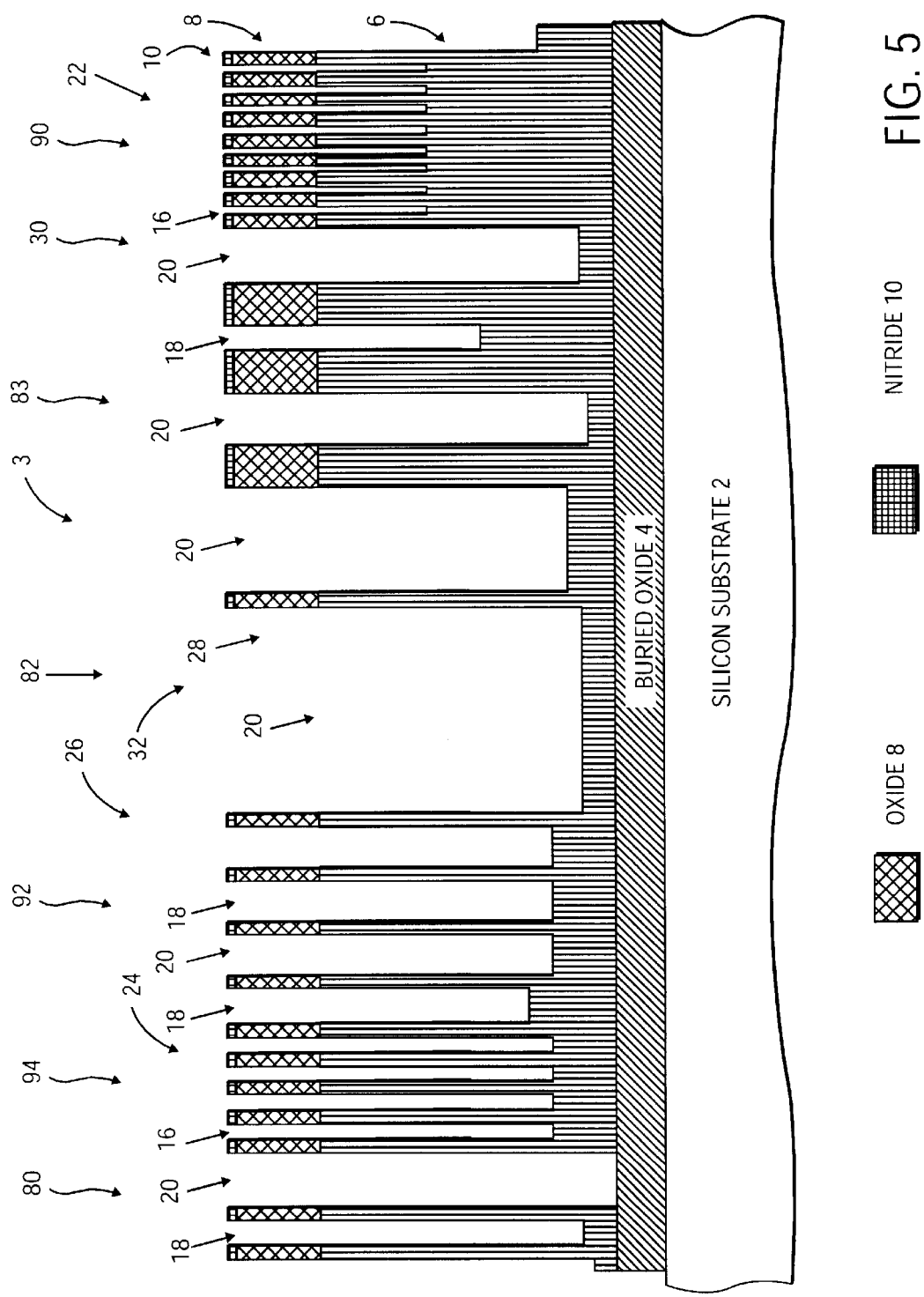
FIG. 5 is a cross-section view of the mask structure of FIG. 1 after exposing the structure to a first etchant.

Turning now to FIG. 5, the first etchant etch optimization performed by steps 305, 310, 315 and 320 may be better appreciated. FIG. 5 illustrates the result of the different etch rates that occur in the different regions of a mask structure. FIG. 5 represents a cross section of etched mask structure 3 which is mask structure 1 of FIG. 1 after exposure to an embodiment of a first etchant according to the present invention. Etched mask structure 3 has been etched by a first etchant for a period of time sufficient for a fastest etch rate region to etch through silicon layer 6. For clarity, mask layer 12 has been omitted from FIG. 5. As illustrated in FIG. 5, region 80 (i.e., a region which has a large critical dimension 20 positioned between a medium critical dimension region 18 and a small critical dimension regions 16) exhibited the fastest etch rate.

FIG. 5 also illustrates the relative etch rates within the mask structure 3 after exposure to an embodiment of a first etchant according to the present invention. Region 82 (i.e., a region with a large critical dimension 20 and high percentage open area 32 adjacent to an isolated line 28) and region 83 (i.e., a region with a large critical dimension 20) etched nearly the same amount of silicon layer 6 as did region 80. On the other hand, etch rates slower than that of region 80 also occurred. For example, the slowest etch rate occurred in the high-density region 22 having the smallest critical dimension 16. Regions having etch rates between these two extremes are also illustrated. Thus, FIG. 5 illustrates the nearly limitless variation in etch rate that maybe induced by structural variations in the mask such as line density, critical dimension and open area percentage. While FIG. 5 illustrates the highest etch rate region occurring at region 80, the highest etch rate region may be found in virtually any portion of the mask structure and must therefore be determined for each mask structure to be optimized. Thus, in this example, since a fastest etch rate occurred in region 80, the duration of the first etchant etch is limited by the time it takes region 80 (i.e., the fastest etch rate region on the mask structure) to etch through the silicon layer 6.

The next step of the present invention according to step 325 is expose the structure to a second etchant. The main problem to be solved with the second etchant etch is removing the layer with minimal loss of an underlying layer or lateral erosion of the layer. A factor in second etchant selection is the ability of the second etchant to provide sidewall passivation. A preferred second etchant would also be selective to an underlying layer. Preferred second etchants are highly selective to an underlying layer. Highly selective in this context refers to the relationship between the etch rate of the layer and to the etch rate of an underlying layer. High selectivity indicates that the underlying layer etch rate will be slower than the etch rate of the layer. In the context of a second etchant etch process according to the present invention, high selectivity means a selectivity of greater than about 30:1 (i.e., the layer etch rate is about 30 times faster than the underlying layer etch rate.)

Second etchant selection may be better appreciated through reference to FIG. 5. A preferred second etchant is selective to buried oxide layer 4 and provides sidewall passivation to prevent lateral etching of silicon layer 6. A selected second etchant removes remaining portions of silicon layer 6 with minimal loss of underlying oxide layer 4 and little or no lateral erosion of silicon layer 6. A selected, suitable second etchant process is selective to the underlying buried oxide layer 4. Highly selective to oxide here means that the ratio between the etch rate of the silicon layer 6 and the etch rate of underlying buried oxide layer 4 will indicate that silicon layer 6 is etched faster than underlying oxide layer 4. In an embodiment of the second etchant according to the present invention, the selectivity of the second etchant etch process to the underlying oxide layer is at least about 30:1 and, preferably, is greater than about 35:1.

A suitable second etchant should also be able to etch, at a reasonable rate, the layer remaining at the completion of the first etchant etch step. In this context, a reasonable etch rate is evaluated for commercial productivity. Etch rates in the hundreds of angstroms per minute are not usually commercially viable while etch rates above about 5,000 Å/min. for a selective etch process are commercially viable. An embodiment of the second etchant according to the present invention provides a layer etch rate of at least 5,000 Å/min. and, preferably, from about 6,000 Å/min. to about 8,000 Å/min.

Referring again to FIG. 5, for example, a suitable second etchant for the mask structure of FIG. 5 is selected to provide a commercially viable silicon etch rate while limiting underlying oxide layer erosion in areas where the silicon layer has been removed by the first etchant. A preferred second etchant also provides sidewall passivation to prevent profile loss and notching of the silicon layer 6. In one embodiment according to the present invention, it is believed that complete silicon layer removal with minimal profile loss and minimial underlying oxide layer erosion may be obtained by providing a plasma of a second etchant that is selected to provide sidewall passivation to the layer and is selective to the underlying layer and maintaining that second etchant plasma etch process until the slowest etch rate region has etched the silicon layer 6. Evaluation of a selected second etchant and second etchant etch process on a specific mask is accomplished according to steps 330, 335 and 340 of process 300 of FIG. 4.

One suitable second etchant and second etchant etch process is formed from an HBr based plasma using high bias RF power levels. For example, a second etchant may include HBr and $O_2$ formed into a plasma. When an HBr and $O_2$ plasma etches, for example, silicon, HBr is the main etchant and also reacts with the silicon and $O_2$ to form a $Si_xBr_yO_z$ polymer for sidewall passivation. Oxygen can be supplied from any of a number of compounds such as, for example, oxygen or oxygen diluted in an inert gas. A diluted oxygen source gas could be provided in a suitable diluted ratio, such as for example, a ratio of about 70% inert gas and 30% $O_2$. One representative inert gas for diluting the oxygen is helium. A preferred oxygen source gas is $O_2$.

In an HBr and $O_2$ plasma, high bias power levels are used to accelerate the Br ions toward the substrate thereby providing a highly anisotropic sputter etch. In this context, high bias RF power level refers to a bias RF power level of more than about 100 Watts and preferably of about 200 Watts. In an alternative embodiment. the ratio of source RF power level to bias RF power level ranges from about 8:1 to about 5:1.

In an embodiment of the second etchant according to the present invention, the second etchant includes HBr and $O_2$ and is formed into an etching plasma. In a preferred embodiment of the second etchant, $O_2$ provides from between about 2% to about 5% of the second etchant. In an alternative embodiment of the second etchant, the second etchant is mostly HBr. In a specific embodiment, the second etchant includes about 97% HBr and about 3% $O_2$. In another specific embodiment, the second etchant is mostly HBr, ignited into a plasma at a pressure of about 20 mT with RF energy where the ratio between the source RF power level to bias RF power level is about 8:1. In another specific embodiment, the second etchant is about 97% HBr, about 3% $O_2$, formed into a plasma from a source RF power level of about 1600 W and a bias RF power level of about 200 Watts at a pressure of about 20 mT.

Once a suitable second etchant is selected (step 325), two determinations are made to optimize the second etchant etch step. First, as set forth in step 335, determine a region of the mask structure with a slowest etch rate. Second, as set forth in step 340, determine the second etchant duration based on a region with a slowest etch rate. These determinations are made based upon the state of the etch process at the end of the first etchant etch step. The second etchant etch begins where the first etchant etch stopped. Accordingly, evaluation of the influence on the second etchant etch rate by the structural variations in a mask structure begins with a mask structure as it appears at the end of the first etchant etch. In other words, the second etchant etch is evaluated on a mask structure that has been etched by a first etchant etch process according to steps 305–320. An example of one such etched mask structure is illustrated in FIG. 5. As illustrated in FIG. 5, the thickness of silicon layer 6 remaining at the end of a first etchant etch step may vary considerably between the different regions of the mask structure.

According to step 330, etch a portion of the mask structure with the second etchant. This step, like step 310, refers to the process of exposing the mask structure to the etchant for a period of time sufficient to determine etch rates for in the various mask structure regions. Determining which region has the s from lowest etch rate (step 335) is determined by comparing the layer thickness in the mask regions before and after step 330. The change in layer thickness is divided by the duration of the etch to determine the etch rate in the regions. Once a slowest etch rate region is selected, the duration of the second etchant etch (step 340) is determined by how long it will take to etch a layer having a thickness measured at the end of a first etchant etch in a slowest etch rate region. It is believed that setting the duration of the second etchant etch based upon a slowest etch rate region achieves complete removal of the layer while reducing the likelihood of underlying layer erosion.

Next, according to step 345, determine whether or not additional wafers are etched. Once an embodiment of a two etchant etch according to the present invention is determined for a mask structure, the embodiment of the two etchant etch may be used to etch additional wafers having a similar mask structure. Thus, a mask structure representative of a number of wafers may be used to determine an appropriate two etchant etch process according to steps 305 through 340. Then, in steps 345 and 350, additional wafers having a similar mask structure are etched using two etchant etch process for that mask structure. Once the additional wafers having a similar mask structure are etched (i.e., the answer to decision block 345 is "No"), processing according to the present invention ends.

In another aspect of the present invention, an embodiment of the etch method of the present invention is selected and based upon an open area percentage of a mask structure end a desire to reduce the likelihood of black silicon formation. Open area percentage end a silicon etch context, for example, is defined as a ratio between an area of silicon to be etched to a total area of a mask structure or and the silicon substrate surface. Open area percentage can be measured on a micro level, for example, the open area percentage for a specific die pattern or on a macro level, for example, the overall open area percentage for a number of die patterns distributed across the substrate or the open area percentage for an entire mask structure. Typical design parameters for electronic device applications such as deep trench isolation, power devices, and high frequency silicon on insulator devices call for open area percentages of less than about 20. On the other hand, design parameters for MEMS applications typically have open area percentages of more than about 20 and may have open area percentages as high as about 80. For purposes of illustration, mask structure 1 of FIG. 1 shows low open area percentage regions, such as region 30, and high open area percentage regions, such as region 32.

In a silicon etch context, for example, open area percentages that are high (i.e., open area percentages above about 20) represent an increased availability of silicon and with it an increased likelihood of silicon spike or black silicon formation. As open area percentage increases, the likelihood that sputtered mask material or etch reaction byproducts may redeposit on the substrate surface and act as a micro mask also increases. The directional etch component needed for vertical sidewalls and anisotropic etching of desired features also results in directional etching around the micromask. As a result of the directional etch component, the micro mask produces spikes. A spike consists of a silicon body with a thin passivating siliconoxyfluoride skin. When viewed by an observer, light with a wavelength less than the length of the spikes will be reflected and caught between spikes thereby making the area with spikes appear dark. Spike formation as a result of directional etching around the micromask is commonly referred to in the art as 'black silicon' because of this observed darkening of the silicon surface. The redeposition of mask material and etch byproducts that result in micromasking and subsequent spike formation are not acceptable because areas which should stay clean become contaminated thereby reducing the useful area of the substrate or mask structure. While the formation of black silicon is more pronounced at higher open area percentages, black silicon formation has been observed in mask structures having open area percentages of about 20.

Figure 6:
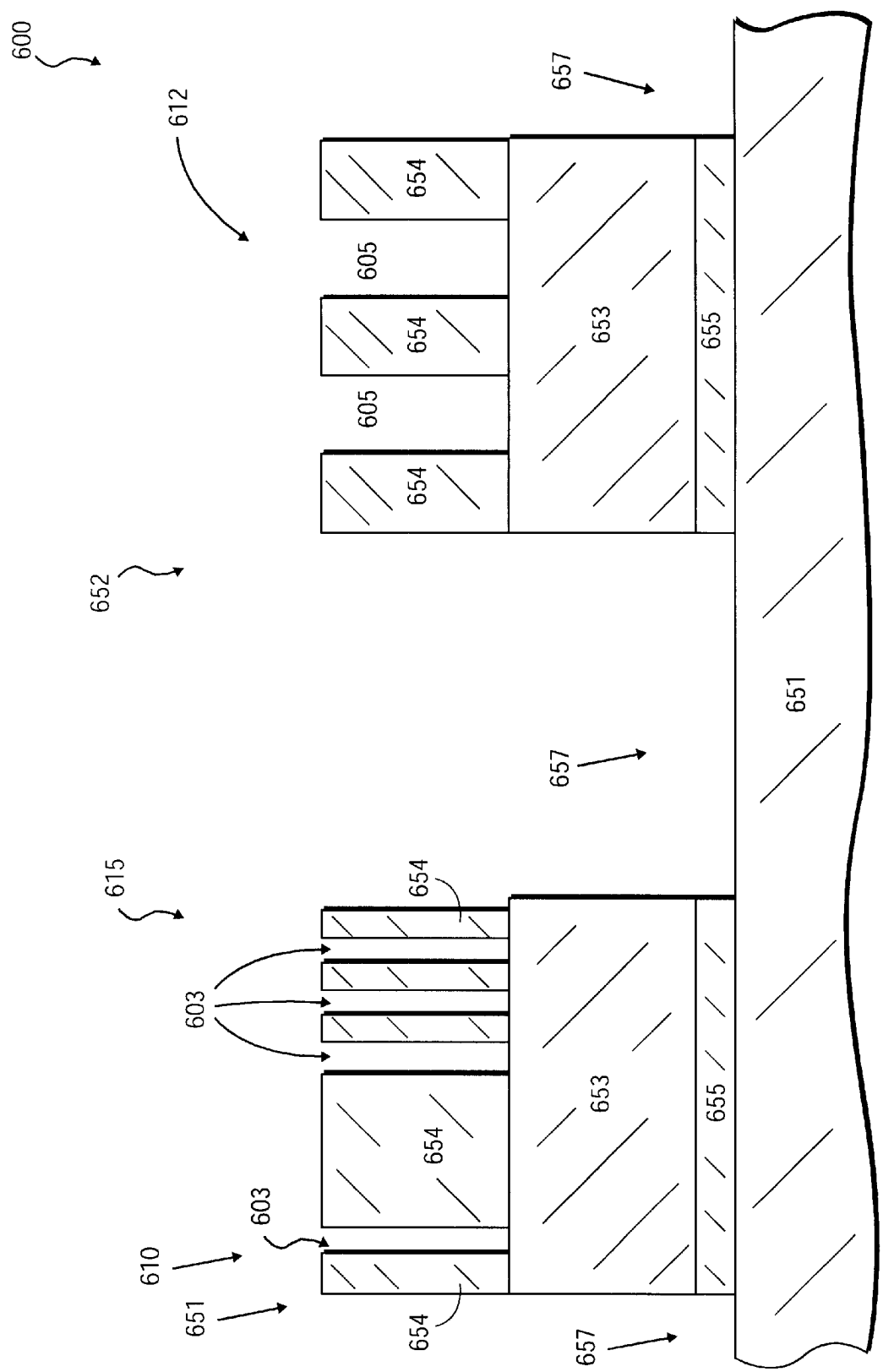
FIG. 6 is a cross-section view of a MEMS structure.

An embodiment of an etch process according to the present invention for mask structures having open area percentages of about or greater 20 will now be described with respect to a mask structure 600 of FIG. 6. FIG. 6 illustrates a cross-section view of a representative mask structure 600 suited to the formation of a number of devices such as, for example, MEMS devices. Mask structure 600 includes a mask layer 654, a layer 653 and an underlying layer 655 all of which are formed on a substrate 651. Mask structure 600 includes areas of isolated lines, high density and low-density lines each having a variety of critical dimensions. The structures of 651 and 652 are illustrative of the types and variety of masking structures that are part of masking structure 600. Masking structure 651 includes an isolated line 610 With a critical dimension 603 (CD1). Masking structure 651 also includes a high-density region 615 with each line having a critical dimension 603 (CD1). Masking structure 652, on the other hand, includes a region of medium density lines 612 each having a larger critical dimension 605 (CD2). For purposes of illustration, CD2 is greater than CD1. In between and adjacent to structures within masking structure 600, such as masking structures 651 and 652, portions of the substrate 651 are exposed. Regions of exposed substrate 657 increased the open area percentage in a mask structure. In addition, larger critical dimension regions such as region 612 of mask the structure 652 may also contribute to increasing the open area percentage of a mask structure.

Masking layer 654 may be formed from any suitable material and is generally selected based upon compatibility with etching layer 653 and the relative etch rates between mask layer 654 and layer 653. Common mask layer materials include, for example, oxides, nitrides and metals. In a silicon etch context, for example, layer 653 may be any form of silicon, such as for example, epitaxial silicon, polysilicon, doped polysilicon, amorphous silicon or combinations thereof. In a silicon etch context, for example, mask structure 600 may include: (1) a mask layer 654 that is an oxide about 5000 Å thick; (2) a layer 653 that is doped polysilicon about 2.5 $\mu$m thick and (3) an underlying layer 655 that is an oxide about 20,000 Å thick. In another representative mask structure, mask structure 600 may include: (1) a mask layer 654 that is an oxide about 10,000 Å thick and (2) a layer 653 that is doped polysilicon about 7 $\mu$m thick.

An embodiment of the present invention particularly useful in reducing the probability of black silicon formation will now be described with regard to flow diagram 300 of FIG. 4. When the percentage open area of a mask structure is greater than or about 20, one embodiment of the first etchant in accordance with the present invention includes a fluorine source gas, an oxygen source gas and a fluorocarbon source gas. In another embodiment, the first etchant includes an oxygen source, a fluorine source and a fluorocarbon source that is ignited into a plasma in an etch chamber such as, for example, chamber 110 to FIG. 3. To provide more precise control of the amounts of oxygen, fluorine and fluorocarbon in the first etchant, three separate sources are provided, one each for an oxygen source, a fluorine source and a fluorocarbon source. Oxygen can be supplied from any of a number of compounds such as, for example, oxygen or oxygen diluted in an inert gas. A diluted oxygen source gas may be provided in a suitable diluted ratio, such as for example, a ratio of about 70% inert gas and 30% $O_2$. One representative inert gas is helium. A preferred oxygen source gas is $O_2$. Fluorine acts as the primary etchant and can be provided from any of a number of multifluorine atom compounds such as, for example, $CF_4$, $NF_3$ and $SF_6$. A preferred fluorine source gas is $SF_6$. Suitable fluorocarbon source gases contain fluorine and carbon in a ratio of two fluorine atoms for each carbon atom. The fluorocarbon source gas is also selected for its ability to provide $(CF_2)_n$ type polymers (i.e., Teflon) or other polymer precursor atoms to promote sidewall passivation. As such, the fluorocarbon source also acts as a passivation gas. Preferred fluorocarbon source gases also provide additional fluorine to promote vertical sidewall profiles and prevent black silicon formation. Suitable fluorocarbon source gases include, for example, $C_2F_4$, $C_3F_6$ and $C_4F_8$. A preferred fluorocarbon source gas is $C_4F_8$.

When a first etch and embodiment includes a fluorine source, an oxygen source, a fluorocarbon source to plasma etch silicon, it is believed each source has a specific function in the silicon etch process. It is believed that the fluorine source gas produces F* (i.e., fluorine radicals) for the chemical etching of the silicon by forming volatile $SiF_4$. It is believed that the oxygen source creates Q* (i.e., oxygen radicals) to passivate the silicon surface with $SiO_xF_y$ and that the fluorocarbon source provides $C_xF_y$ precursors for sidewall passivation. Additionally, it is believed $XF_x^+$ ions, formed from either or both of the fluorine source and the fluorocarbon source, etch the $SiO_xF_y$ layer. For example, $C_4F_8$ may form $CF_x^+$ that etches in this plasma by forming volatile $CO_xF_y$ and $SF_6$ may form $SF_x^+$ that etches in this plasma by forming volatile $SO_xF_y$. An embodiment of the first etch ant according to the present invention provides each of the sources in a suitable ratio that forms an anisotropic silicon etching plasma which, advantageously, results in smooth, vertical sidewall profiles without black silicon formation.

In an embodiment of a first etchant etch process for etching a mask structures having an open area percentage of more than or about 20, the first etchant includes a fluorine source gas flow rate that is about twice the fluorocarbon source gas flow rate and the oxygen source gas flow rate is about three times the fluorocarbon source gas flow rate. In a specific embodiment, the fluorine source gas is $SF_6$, the oxygen source gas is $O_2$ and the fluorocarbon source gas is $C_4F_8$. In an alternative embodiment, the fluorine source gas flow rate is about 60 sccm, the oxygen source gas flow rate is about 90 sccm and fluorocarbon source gas flow rate is about 30 sccm. In a preferred embodiment, the fluorine source gas is $SF_6$, and fluorocarbon source gas is $C_4F_8$. To some embodiment of a first etch ant according to the present invention are particularly useful in etching a mask structure having an open area percentage of about 80.

In an embodiment of the first etchant, the first etchant includes a fluorine source gas, an oxygen source gas and a fluorocarbon source gas. In a specific embodiment of the first etchant, the fluorine source gas flow rate is about three times the flow rate of the fluorocarbon source gas flow rate and the flow rate of the oxygen source gas is more than about four times the flow rate of the fluorocarbon source gas. In a specific embodiment, the fluorine source gas is $SF_6$, the oxygen source gas is $O_2$ in the fluorocarbon source gas is $C_4F_8$. In a preferred embodiment of the first etchant, the fluorocarbon source gas is $C_4F_8$ with a flow rate of about 20 sccm. In another preferred embodiment, the fluorocarbon source gas is $C_4F_8$ with a flow rate of about 20 sccm, the oxygen source gas is $O_2$ with a flow rate of about 90 sccm and the fluorine source gas is $SF_6$ with a flow rate of about 60 sccm.

In another preferred embodiment of the first etchant, the first etchant is ignited into a plasma where the fluorine source gas is $SF_6$ and provides between about 19 percent to about 41 percent of the first etchant; the oxygen source gas is $O_2$ and provides between about 41 percent to about 57 percent of the first etchant; and the fluorocarbon source gas is $C_4F_8$ and provides between about 14 percent to about 24 percent of the first etchant.

In an embodiment of the present invention with a first etchant is a plasma, the first etchant includes an oxygen source gas, a fluorine source gas and a fluorocarbon source gas formed into a plasma in an etch chamber such as, for example, a DPS chamber 110 of FIG. 3, by applying RF energy from the source 118 and bias 122 RF generators. The source RF generator 118 provides inductive power into the plasma for the formation of or control of the plasma density and the bias RF generator 122 provides bombardment energy and directionality of ions to the substrate 114. Other methods of generating a plasma from the first etchant may be utilized. For example, plasma may be formed by capacitively coupling RF energy into an etch chamber, such as, for example, in a parallel plate etch reactor. The first etchant may also be remotely activated, such as by a conventional remote microwave source, and then provided into a chamber holding the substrate.

In a specific embodiment where a first etchant is formed into a plasma, the source RF power level is less than about 1000 W and the bias RF power level is less than about 100 W. In a specific embodiment the source RF power is about 700 Watts. In another specific embodiment the ratio of the source RF power level to the bias RF power level is less than about 25:1. In an alternative embodiment, the ratio of the source RF power level to the bias RF power level is about 23:1. In one preferred embodiment, the source RF power level is about 700 Watts and a bias RF power level is about 30 Watts.

In an alternative embodiment where a first etchant is formed into a plasma, the ratio of the source RF power level to the bias RF power level is less than about 15:1. In a specific embodiment, the ratio of the source RF power level to the bias RF power level is about 10:1. In a specific preferred embodiment, the RF source power level is about 700 Watts and RF bias power level is about 70 Watts.

Pressure may be regulated when etching with a plasma formed from the first etchant, for example referring to chamber 110 in FIG. 3, by throttle valve 127. Generally, pressure is maintained in a range of less than 100 mT and preferably less than 50 mT during a first etchant etch step. In a particular embodiment, for example, pressure within chamber 110 could be maintained at about 20 mT. It is to be appreciated that the steps of introducing a gaseous first etchant, igniting the first etchant into a plasma and controlling the pressure within the chamber are presented and described here serially for clarity. One of ordinary skill will appreciate that the steps could be performed in a different order or nearly simultaneously.

Next according to step 310, etch a portion of the layer in a mask structure with the first etchant. As previously discussed, steps 310, 315 and 320 are used to determine the effect of the mask structure variations in line density, critical dimension and open area percentage on the etch rate of a first etchant. In particular, when the mask structure open area percentage is about or greater than 20, the etch rate variation of a first etchant that includes a fluorine source, and oxygen source and a fluorocarbon source is evaluated. It is to be appreciated that high open area percentage mask structure here also include regions having different critical dimensions, line spacing and line density.

Once initial layer thickness measurements are taken on the mask structure, the substrate is loaded into a processing chamber and exposed to an embodiment of the first etchant that includes a fluorine source, an oxygen source and a fluorocarbon source. In an embodiment of the first etchant according to the present invention, the first etchant is ignited into a plasma. The mask structure is exposed to the plasma for a period of time sufficient to obtain an average etch rate. In general, etching periods of about 90 seconds to about 300 seconds are sufficient to evaluate etch rate. The length of time needed to evaluate the relative etch rates will vary depending upon several factors, such as, line density and critical dimension of the mask structure, for example.

After measuring post etch layer thicknesseses, the etch rate may be easily calculated. Once the first etchant etch rate for the various regions of the mask structure is calculated, the etch rates are compared to determine a region with a fastest etch rate (Step 315). Once a region with a fastest etch rate is determined, the duration of the first etchant etch step is obtained by estimating how long it will take a fastest etching region to etch the layer (step 320).

Figure 7:
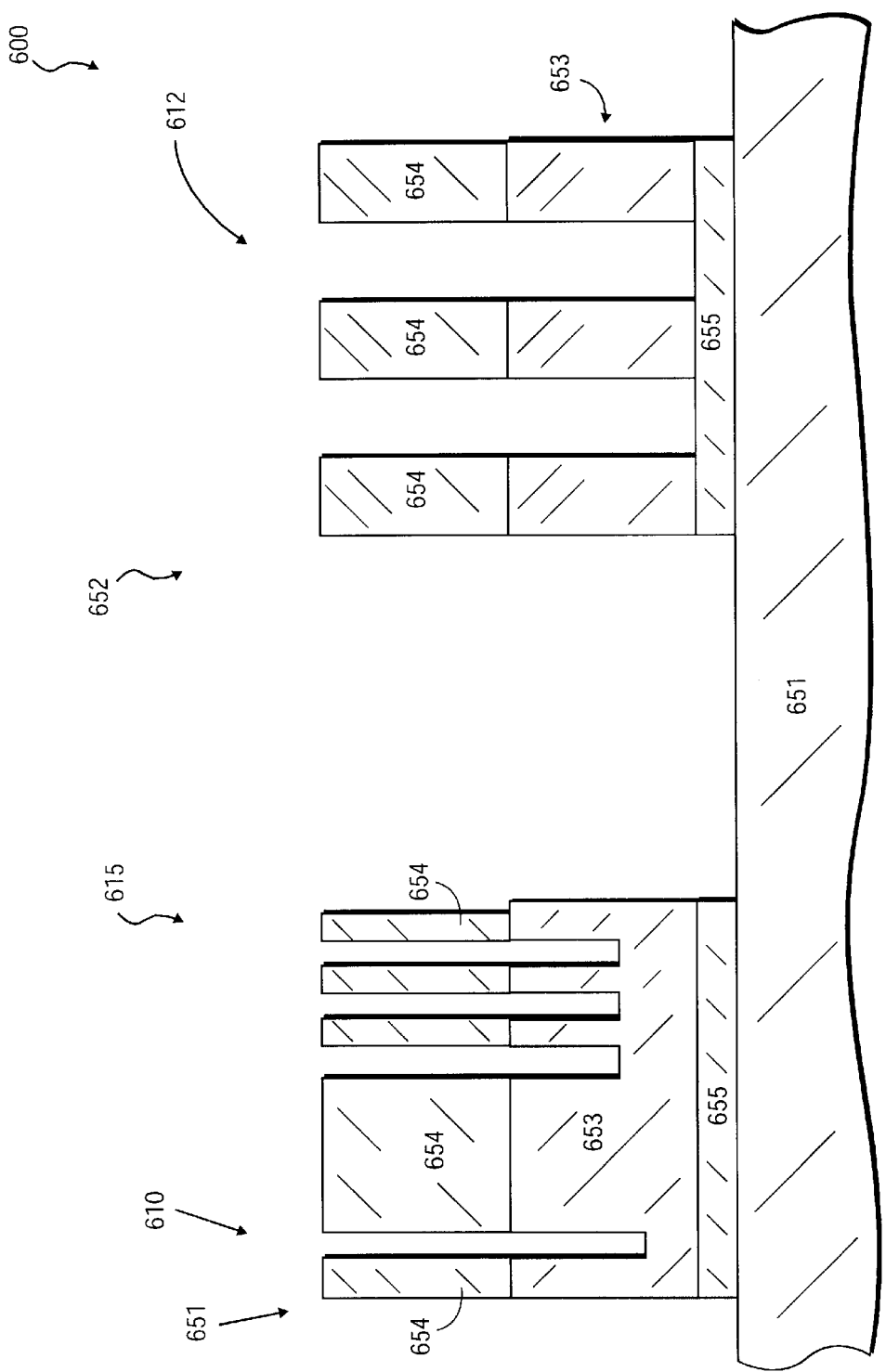
FIG. 7 is a cross-section view of the MEMS structure of FIG. 6 after exposing the structure to a first etchant.

FIG. 7 illustrates a masking structure 600 at the end of a first etchant etch step with a duration of the etch has been selected in accordance with the present invention. In this example, mask structure 612 is the fastest etching region (step 315) and the duration of the first etchant etch is sufficiently long so that layer 653 within structure 652 is etched during the first etchant etch. For example, FIG. 7 represents an optimized first etchant etch step for a representative mask structure 600 where the first etchant etch duration has been set so that the silicon layer in medium density structure 612 (i.e., a fastest etching region) is completely etched during the first etchant etch step. FIG. 7, like FIG. 5, illustrates the fact that different thicknesses of silicon layer 653 will remain in the various mask regions at the end of the first etchant etch step.

Once the first etchant etch step has been determined for a mask structure, the second etchant etch step is selected according to steps 325–340. As described above with regard to FIG. 5 and the earlier described second etchant etch process. several factors are considered when evaluating the second etchant etch. First, the second etchant should etch the layer remaining in the mask structure at the end of the first step at a commercially reasonable rate. Turning briefly to FIG. 7 which represents the masking structure 600 at the end of a first etchant etch. As expected, portions of the mask structure 600 having etch rates slower than the high etch rate region 612 will have silicon layers 653 of various thicknesses remaining at the end of the first etchant etch. In mask structure 600, for example, mask structure 656 etched the fastest, isolated line 610 etched next fastest and high-density region 615 etched the slowest. Accordingly, silicon layer 653 has been removed in region 612 (i.e., a fastest etching region) and different amounts of silicon layer 653 remain to be etched in the slower etching regions 615 and 610.

A second consideration in evaluating that the second etchant is selectivity to an underlying layer. Selectivity is important so that if the layer is removed in an area prior to the end of the second etchant etch process, erosion of the underlying layer in that area is minimized. A third consideration is the ability of a particular second etchant to provide sidewall passivation to prevent lateral erosion of the layer thereby maintaining profile control of the layer. A fourth consideration is reducing the probability of black silicon formation when etching a mask structure having an open area percentage of about or greater than 20. An embodiment of a second etchant in accordance with the present invention may be selected to address these considerations.

In an embodiment of the second etchant according to the present invention, the second etchant includes HBr and $O_2$. In another embodiment of the second etchant of the present invention, substantially all of the second etchant is HBr and the second etchant is formed into a plasma. In one specific embodiment of the second etchant, the second etchant includes HBr and $O_2$ wherein, the ratio of the HBr flow rate to the oxygen flow rate is more than 45:1. In one preferred embodiment, the ratio of the HBr flow rate to the oxygen flow rate is about 48:1. In an alternative embodiment, the second etchant includes HBr and $O_2$ where the $O_2$ provides from about 2 percent to less than about 5 percent of the second etchant. In another embodiment the HBr flow rate is more than 200 sccm and the oxygen flow rate is less than 10 sccm. In a specific preferred embodiment of the second etchant, the HBr flow rate is about 240 sccm and the $O_2$ flow rate is about 5 sccm.

In yet another embodiment of the second etchant according to the present invention, the second etch and is a plasma that includes HBr and chlorine. A preferred chlorine source is $Cl_2$. In one embodiment, the second etchant etch process is conducted by a plasma formed from HBr and $Cl_2$ where at least about 60 percent of the second etchant is provided by HBr. In yet another embodiment of the second etchant, the second etchant etch is conducted by a plasma formed from HBr and $Cl_2$ where at least about 30 percent of the second etchant is $Cl_2$. In one specific embodiment of the second etchant. the second etchant includes HBr and $Cl_2$ where the HBr flow rate is greater than about 100 sccm and the ratio of the HBr flow rate to the $Cl_2$ flow rate is at least about 2:1. In an alternative embodiment of the second etchant, the second etchant includes HBr and $Cl_2$ where the flow rate of the HBr is at least about twice the $Cl_2$ flow rate. In another embodiment, the flow rate of the $Cl_2$ is about 60 sccm.

In one embodiment of the present invention, the second etchant is a plasma etch. In the case where the second etchant is provided into an etch chamber, for example in a DPS chamber like chamber 110 of FIG. 3, a second etchant may be formed into a plasma by applying RF energy from the source 118 and bias 122 RF generators. Generally, the source RF generator 118 provides mostly inductive power for the formation of and control of the plasma density and bias RF generator 122 provides bombardment energy and directionality of ions onto the substrate 114.

In another embodiment of the second etchant according to the present invention, a second etchant is a plasma formed from a source RF power level of more than about 1500 Watts and bias RF power level of more than about 150 Watts. In a specific embodiment, the source RF power level is more than about 1500 Watts in the ratio of the source RF power level to the bias RF power level is about 8:1. In another specific embodiment, the bias RF power level is about 200 Watts and the ratio of the source RF power level to the bias RF power level is about 8:1. In one preferred embodiment, the source RF power level is about 1600 Watts and bias RF power level is about 200 Watts.

In an alternative embodiment of the second etchant according to the present invention, a second etchant is a plasma formed from a source RF power level of at least about 1000 Watts with a ratio of source RF power level to bias RF power level of at least about 5:1. In a specific embodiment, the bias RF power level is at least about 200 Watts and the ratio of the source RF power level to the bias RF power level is at least about 5:1. A specific embodiment, the source RF power level is about 1000 Watts and the bias RF power level is about 200 Watts.

Referring for example to FIG. 3 and chamber 110, throttle valve 127 may be used to regulate pressure during an etch using an embodiment of the second etchant. In several embodiments of the second etchant according to the present invention, pressure is maintained in a range of less than about 100 mT. In a particular embodiment of the second etchant, a pressure maintained during the second etchant etch step is about the same as a pressure maintained during the first etchant etch step. In another embodiment of the present invention, the pressure used during the second etchant etch is less than the pressure used during the first etchant etch and, preferably, the second etchant etch is conducted at a pressure that is about half of the pressure at which the first etchant etch is conducted.

In one preferred embodiment of the present invention, the second etchant etch step is conducted at about 20 mT. In another preferred embodiment, the second etchant etch step is conducted at a pressure of about 10 mT. In yet another preferred embodiment, both the first and second etchant are plasmas and the plasma etch processes are conducted at a pressure of about 20 mT. In a specific preferred embodiment, the first and second etchants are formed into plasmas and the first etchant plasma etch is conducted at a pressure of about 20 mT and the second etchant plasma etch is conducted at a pressure of about 10 mT.

Once a suitable second etchant etch process is selected, two determinations are made to optimize the second etchant etch to a particular mask structure. First, as set forth in step 335, determine a region of the mask structure with a slowest etch rate. Second, as set forth in step 340, determine the duration of the second etchant etch. However, the determinations of steps 335 and 340 and the exposure and etch of steps 325 and 330 are based upon the state of the etch process at the end of the first etchant etch. The second etchant etch begins where the first etchant etch stopped. Accordingly, evaluation of the relationship between a second step etchant etch rate and the structural variations of a mask begins with the mask structure as it appears at the end of etching with a first etchant according to the present invention. In other words, referring to FIG. 7 and an embodiment of the present invention where a first and a second etchant are formed into plasmas, the second etchant plasma etch is evaluated on a mask structure 600 that has been etched by a first etchant plasma etch process determine according to steps 305–320. In an example of one such etched mask structure, is illustrated in FIG. 7 where in masked structure 612 the first etchant plasma etched through polysilicon layer 653 while end mask structure 651 the first etchant plasma did not etch through polysilicon layer 653.

According to steps 325 and 330, expose the structure to a second etchant and etch a portion of a layer with the second etchant. These steps refer to the process of exposing the mask structure etched by a first etchant etch according to the present invention to a second etchant etch for a period of time sufficient to determine the etch rates in the various mask structure regions. Referring by way of example to FIG. 7, the etch rate of isolated line region 610 is compared to the etch rate of high-density line region 615.

Determining a region of the layer with a slowest etch rate (step 335) is determined by comparing the layer thickness in each of the mask regions before and after etching according to step 330. The change in layer thickness is then divided by the duration of the etch to determine the etch rate for the various regions. Once a slowest etch rate region is selected, the duration of the second etchant etch (step 340) is determined by how long it will take to etch the layer in a slowest etching region. It is believed that setting the duration of the second etchant etch step based upon the etch rate of a slowest etch rate region achieves complete removal of the layer while minimizing erosion of the exposed underlying layer and lateral erosion of the layer.

Evaluation of the relative etch rates in the various mask structure regions may be better appreciated through reference to FIG. 7. FIG. 7 represents the relative thicknesses of polysilicon layer 653 after etching with a first etchant according to the present invention where region 612 of structure 652 is a fastest etching region. The initial thicknesses of polysilicon layer 653 in region 615 and region 610 are taken. The mask structure 600 of FIG. 7 is exposed to an embodiment of the second etchant according to the present invention. After exposing the structure to the second etchant for a sufficient period of time to evaluate etch rate, the post etch thicknesses of the polysilicon layer 653 in regions 615 and 610 are measured. The change in layer thickness is divided by the duration of the etch to determine the etch rate in each region. Once a slowest etching region is selected, the duration of the second etchant etch (step 340) is determined by how long it will take to second etchant to etch the silicon layer 653 remaining in the slowest etching region at the end of a first etchant etch. It is believed that setting the duration of the second etchant etch step based upon a slowest etch rate region achieves complete removal of the silicon layer 653 while minimizing erosion of the buried oxide layer 655 and lateral erosion of silicon layer 653.

Next, decision step 345 is used to determine whether or not additional wafers are to be etched. Once an embodiment of a two etchant etch method according to the present invention has been determined for a particular mask structure, that to etching method may be used to process additional substrates having a similar mask structure. Thus, a mask structure representative of a number of wafers may be used to determine a suitable embodiment of a two etchant etch method according to steps 305 through 340 of the present invention. Then, in steps 345 and 350, additional wafers having a similar mask structure are etched using the two etchant etch method determined for that particular mask structure. Once the additional wafers having a similar mask structure have been etched (i.e., the answer to decision block 345 is "No"), etching according to the present invention is complete.

Some embodiments of a two etchant etch method according to the present invention may be better appreciated through reference to the specific examples that follow.

In a specific embodiment of a to etchant etch method according to the present invention, the method is determined for a silicon on insulator structure, where a first etchant is a plasma that etches silicon at a rate of between about 2 $\mu$m/min. to about 4 $\mu$m/min, formed from a mixture of about equal parts $SF_6$, HBr and $O_2$ at a pressure of about 25 mT and a source RF power level less than about 1000 Watts and a ratio of source RF power level to bias RF power level of about 35:1, and a second etchant is a plasma formed from mostly HBr at a pressure of lower than the first etchant plasma etch pressure with a source RF power level more than twice the source RF power level of the first etchant plasma and a ratio of the source RF power level to the bias RF power level of about 8:1.

In another specific embodiment of a two etchant etch method according to the present invention, the first and second etchant are plasmas optimized for a silicon on insulator structure where, a first etch and plasma is formed from $SF_6$, HBr and $O_2$ where the HBr and the $O_2$ are provided at about equal rates and the $SF_6$ is provided at a rate that is less than each of the HBr and $O_2$ rates, at a pressure of about 25 mT. ignited by a source RF power level of about 700 Watts and a bias RF power level of less than about 50 Watts, and a second etchant plasma is formed from HBr and $O_2$ where the flow rate of the HBr is about 40 times flow rate of the $O_2$ and the flow rate of the $O_2$ is less than about 10 sccm; at a pressure of about 20 mT; ignited by a source RF power level in the second etchant plasma that is more than twice the source RF power level in the first etchant plasma and a bias RF power level in the second etchant plasma that is about 10 times the bias RF power level of the first etchant plasma wherein the selectivity of the second etchant plasma to an underlying layer in the silicon on insulator structure is at least about 35:1.

In a preferred embodiment, a first etchant plasma is formed from a mixture of about 55 sccm $SF_6$, about 60 sccm HBr and about 60 sccm $O_2$ at a pressure of about 25 mT; a source RF power level of about 700 Watts and a bias RF power level of about 20 Watts, and a second etchant plasma is formed from a gaseous mixture of about 240 sccm HBr and less than about 10 sccm $O_2$, a pressure of about 20 mT, a source RF power level of about 1600 Watts and bias RF power level of the least about 200 Watts, and a selectivity of the second etchant plasma to an underlying layer of at least about 40:1.

In another specific embodiment of a two etchant etch method according to the present invention, the first and second etchant are plasmas optimized to etch a polysilicon layer of a silicon on insulator structure having an open area percentage of greater than or about 20 percent, where a first etchant plasma is formed from a gaseous mixture of a fluorine source gas, a fluorocarbon source gas and an oxygen source gas where the fluorine source gas flow rate is about twice the fluorocarbon source gas flow rate and the oxygen source gas flow rate is about twice the fluorocarbon source gas flow rate, the pressure is maintained at less than about 50 mT and the plasma is formed by igniting the gaseous mixture with a source RF power level of less than about 1000 Watts where the ratio of the source RF power level to the bias RF power level it is at least about 25 to 1, and a second etchant plasma is formed from a gaseous mixture of mostly HBr at the same pressure as the first etchant plasma, with a source RF power level that is more than twice the first etchant plasma source RF power level and a bias RF power level that is more than six times the first etchant plasma bias RF power level.

In yet another specific embodiment of a two etchant etch method according to the present invention, the first and second etchant are plasmas, optimized for etching a silicon layer in a mask structure having an open area percentage greater than or about 20, wherein a first etchant plasma is formed from a gaseous mixture of about 60 sccm $SF_6$, about 90 sccm $O_2$ and about 30 sccm $C_4F_8$ at a pressure of about 20 mT and a bias RF power level of less than about 50 Watts and a ratio of the source RF power level to the bias RF power level of at least about 25 to 1, a second etchant plasma is formed from a gaseous mixture of HBr and $O_2$ where the ratio of the HBr flow rate to the $O_2$ flow rate is at least about 48:1 and the HBr flow rate is less than about 250 sccm; the pressure in the second etchant plasma etch is about the same as the pressure in first etchant plasma etch and the source RF power level is more than about 1500 Watts and the ratio of the source RF power level to the bias RF power level is at least about 5:1. In a preferred embodiment of the second etchant plasma etch, a source RF power level is about 1600 Watts and a bias RF power level is at least about 200 Watts.

In a preferred embodiment, a first etchant plasma is formed from a gaseous mixture that includes a fluorine source gas, an oxygen source gas and a fluorocarbon source gas where the flow rate of the fluorocarbon source gas is less than about 50 sccm, the flow rate of the fluorine source gas is about twice the flow rate of the fluorocarbon source gas and the flow rate of the oxygen source gas is about three times the flow rate of the fluorocarbon source gas; the source RF power level is maintained at about 700 Watts and the bias RF power level is about 30 Watts and the pressure is about 20 mT;

a second etchant plasma is formed from a gaseous mixture of HBr and $O_2$ where HBr are makes up about 98% of the second etchant total gas flow; the pressure is maintained at about 20 mT, the source RF power level is about 1600 Watts and the second plasma bias RF power level is more than about six times the first plasma bias RF power level.

In another embodiment, a two etchant plasma etch method according to the present invention is used to etch a layer that is part of a high open area percentage structure. The plasma etch method has a first etchant plasma formed from a gaseous mixture that includes a fluorine source gas, an oxygen source gas and a fluorocarbon source gas where the fluorine source gas flow rate is about three times the fluorocarbon source gas flow rate, the oxygen source gas flow rate is more than about four times the fluorocarbon source gas flow rate, the pressure is maintained at about 20 mT, and the source RF power level is less than about 1000 Watts and the ratio of the source RF power level to the bias RF power level is at least about 10:1; and a second etchant plasma formed from a gaseous mixture of HBr and $Cl_2$ at a pressure of less than the first etchant plasma pressure, with a source RF power level of about 1000 Watts and a bias RF power level in the second plasma that is more than 2.5 times the bias RF power level in the first plasma.

In another specific embodiment, a first etchant plasma is formed from a gaseous mixture of $SF_6$, $O_2$ and $C_4F_8$ where the combined $SF_6$ and $C_4F_8$ flow is less than the total $O_2$ flow, the bias RF power level is less than about 100 Watts and the source RF power level is about 10 times the bias RF power level and the pressure is about 20 mT, and a second etchant plasma is formed from a gaseous mixture of HBr and $Cl_2$ where the $Cl_2$ flow rate is less than about 100 sccm and the HBr flow rate is at least about twice the $Cl_2$ flow rate, the source and bias RF power levels in the second plasma are greater than the source and bias RF power levels in the first plasma and the ratio of the second plasma bias RF power level to the first plasma bias RF power level is at least about 2:1.

In another specific embodiment, a layer within the structure is formed from polysilicon and the structure has an open area percentage of at least about 80 percent, a first etchant plasma is formed from a gaseous mixture of $SF_6$, $O_2$ and $C_4F_8$ where the $SF_6$ is it least about 30 percent of the first etchant, the $O_2$ is at least about 50 percent of the first etchant and the $C_4F_8$ makes up at least about 10 percent of the etchant; that a pressure maintained at about 20 mT. with a source RF power level of at least about 700 Watts and a bias RF power level of at least about 70 Watts; and a second etchant plasma is formed from a gaseous mixture where HBr makes up at least about 60 percent of second etchant and $Cl_2$ makes up at least about 30 percent of the second etchant; at a pressure maintained at about 10 mT, with a the source RF power level of about 1000 Watts and the bias RF power level of about 200 Watts.

In another specific embodiment of a two etchant etch method according to the present invention, a layer of silicon that is part of a mask structure having a high open area percentage is etched using a two etchant plasma etch method where, the source RF power level is less than about 1000 Watts and the ratio of the source RF power level to the bias RF power level is between about 20:1 and about 30:1, and preferably the source RF power level is from between about 500 Watts to about 2000 Watts and the ratio of the source RF power level to the bias RF power level is from about 20:1 to about 28:1, and a first etchant plasma is formed from a gaseous mixture of $SF_6$, $O_2$ and $C_4F_8$ where between about 19 percent to about 41 percent of the first etchant is provided by $SF_6$; between about 41 percent to about 57 percent of the first etchant is provided by $O_2$; and between about 14 percent to about 24 percent of the first etchant is provided by $C_4F_8$; or, alternatively, a first etchant is a plasma formed from $SF_6$, $O_2$ and $C_4F_8$ and having about equal parts $SF_6$, and $O_2$ with the remainder of the first etchant provided by $C_4F_8$, where preferably, the $C_4F_8$ is less than about 20% of the first etchant, and more preferably, the $C_4F_8$ is about 17% of the first etchant; or, alternatively, a first etchant is a plasma formed from $SF_6$, $O_2$ and $C_4F_8$ where the amounts of $SF_6$ and $O_2$ in the first etchant are at least about twice the amount of $C_4F_8$ in the first etchant and, preferably, the percentage of $O_2$ in the first etchant is greater than the percentage of $SF_6$ in the first etchant; or alternatively, a first etchant plasma is formed from a gaseous mixture of $SF_6$, $O_2$ and $C_4F_8$ where about half the total gas flow is provided by $O_2$, and about 20% of the total gas flow is provided by $C_4F_8$; or alternatively, a first etchant plasma is formed from a gaseous mixture of $SF_6$, $O_2$ and $C_4F_8$ where about half the total gas flow in the first step is provided by $O_2$ and the remainder of the total gas flow is provided by equal parts $SF_6$, and $C_4F_8$, and preferably, $SF_6$ makes up about 26% of the first step total flow and $C_4F_8$ makes up about 22% of the first step total flow; or alternatively, a first etchant plasma is formed from a gaseous mixture of $SF_6$, $O_2$ and $C_4F_8$ where about half the total gas flow in the first step is provided by $O_2$ and $SF_6$ makes up about 20% of the total gas flow, and, preferably, about half the total gas flow in the first step is provided by $O_2$ and the remainder of the total gas flow is about 19% $SF_6$ and about 24% $C_4F_8$; or, alternatively, a first etchant plasma is formed from a gaseous mixture of $SF_6$, $O_2$ and $C_4F_8$ where about 30% of the first etchant is provided by $SF_6$ and about 15% of the first etchant is provided by $C_4F_8$; or, alternatively, a first etchant plasma is formed from $SF_6$, $O_2$ and $C_4F_8$ where more than half the first etchant is provided by $O_2$, less than 20% of the first etchant is provided by $C_4F_8$, and preferably, more than half the first etchant is provided by $O_2$, $C_4F_8$ provides about 18% of the first etchant and $SF_6$ provides about 27% of the first etchant; and a second etchant plasma is conducted in accordance with an embodiment of a second etchant etch step as set forth above.

It is to be appreciated that the present invention is not limited to dry etching processes, plasma etching processes or to etching silicon as part of a silicon on insulator structure. An embodiment of the present invention provides an etch process that etches a layer with a first etchant for a sufficient period of time for the fastest etching portion of the layer to be etched. Next, the layer is etched by a second etchant for a period of time sufficient for a slowest etching portion of the layer to be etched. In another embodiment of the present invention, the second etchant provides a sidewall passivation to the layer being etched. In yet another embodiment of the present invention, the second etchant is selective to an underlying layer.

Although present invention has been disclosed illustratively using a DPS process chamber, the invention is not limited to this specific type of chamber and may be practiced in other etch equipment. For example, a bias RF generator operating at another frequency may be used to provide a comparable amount of RF power to the support pedestal. For example, a bias RF generator providing 60 W at about 13 MHz is comparable to a bias RF generator providing 25 W at about 400 kHz.

Embodiments in accordance with the present invention may be practiced in a variety of etch process chambers such as, for example, a capacitively coupled etch chamber, a parallel plate, capacitively coupled etch chamber, or an etch chamber that combines capacitive and inductive coupling. Embodiments according to the present invention may also be practiced using other conventional dry etch techniques. For example, embodiment of the first and second etchants may be activated remotely using well-known remote activation methods and equipment and then provided to an etch process chamber to perform an etch process in accordance with the teachings of the present invention.

Mention has been made of the poor thickness uniformity associated with deposited silicon films and the ability of the present invention to compensate for this variation. Embodiments of the two step plasma etch method of the present invention may be used to compensate for etch rate variations attributable to the structural variations in the mask structure. It is to be appreciated that embodiments of the two step plasma etch process of the present invention may also be advantageously utilized to etch layers formed within a mask structure where the layer exhibits superior uniformity thickness or thickness uniformity of less than 4%. For example, embodiments of the present invention may be used to etch an epitaxial silicon layer having superior thickness uniformity that is part of an SOI structure. In this case, etch rate variations induced by structural variations of the mask occur even though the uniformity of the epitaxial layer is excellent. In this regard, the two step plasma etch method of the present invention, while illustratively described with regard to etching a particular type of silicon layer in a specific SOI structure, the inventive method may also be used to etch other types of silicon layers, such as, for example, polysilicon, doped polysilicon, amorphous silicon, or combinations thereof.

While embodiments of the low open area percentage etch process of the present invention have been described with regard to a silicon on insulator (SOI) structure, low open area percentage structures may also occur in MEMS structure or structures combining MEMS and electronics. Embodiments the low open area percentage, two step plasma etch process may be used on these types of structures as well. Similarly, while the high open area percentage etch process has been described with regard to a MEMS structure, masking structures for electronics or for structures having a combination of electronics and MEMS may also have hi gh open area percentages or open area percentages greater than about 20. Embodiments of the high open area percentage, two step plasma etch method of the present invention may be utilized on these structures as well.

These, and other modifications, will occur to those of ordinary skill in the art of silicon etching and are included within the scope of the present invention, which is limited only by the claims that follow.

We claim:

1. A method of etching a layer formed over an underlying layer in a structure, the method comprising the steps of:

exposing the structure to a first etchant including a fluorocarbon source gas that etches the layer for a first period of time sufficient for a first region of the layer with a fastest etch rate to be etched through; and exposing the structure to a second etchant that etches the layer for a second period of time sufficient for a second region of the layer with a slowest etch rate to be etched through.

2. The method according to claim 1 wherein said first etchant further includes an oxygen source gas and a fluorine source gas.

3. The method of claim 2 wherein said fluorocarbon source gas, said oxygen source gas, and said fluorine source gas are in a ratio suitable for forming an anisotropic silicon etching plasma.

4. The method according to claim 2 wherein the fluorine source gas is selected from the group consisting of $CF_4$, $NF_3$, and $SF_6$.

5. The method according to claim 1 wherein the fluorocarbon source gas is selected from the group consisting of $C_2F_4$, $C_3F_6$, and $C_4F_8$.

6. The method according to claim 1 wherein said first etchant comprises $C_4F_8$, $SF_6$, and $O_2$.

7. The method according to claim 6 wherein said second etchant comprises HBr.

8. The method according to claim 7 wherein the second etchant further comprises $O_2$.

9. The method according to claim 7 wherein said second etchant further comprises $Cl_2$.

10. The method according to claim 1 wherein said second etchant comprises HBr.

11. The method according to claim 10 wherein the second etchant further comprises $O_2$.

12. The method according to claim 10 wherein said second etchant further comprises $Cl_2$.

13. A method of etching a layer formed over an underlying layer in a structure, the method comprising the steps of:

exposing the structure to a first etchant including
a fluorocarbon source gas,
an oxygen source gas, and
a fluorine source gas that etches the layer for a first period of time sufficient for a first region of the layer with a fastest etch rate to be etched through; and exposing the structure to a second etchant comprising HBr that etches the layer for a second period of time sufficient for a second region of the layer with a slowest etch rate to be etched through.

14. The method of claim 13 wherein the second etchant further comprises $O_2$.

15. The method of claim 13 wherein the second etchant further comprises $Cl_2$.

16. A method of etching a layer formed over an underlying layer in a structure, the method comprising the steps of:

exposing the structure to a first etchant including HBr, $SF_6$, and $O_2$ that etches the layer for a first period of time sufficient for a first region of the layer with a fastest etch rate to be etched through; and exposing the structure to a second etchant including HBr that etches the layer for a second period of time sufficient for a second region of the layer with a slowest etch rate to be etched through.

17. The method of claim 16 wherein the second etchant further comprises $Cl_2$.

18. The method of claim 16 wherein the second etchant further comprises $O_2$.

* * * * *